(12) United States Patent
Kent et al.

(10) Patent No.: US 9,082,888 B2
(45) Date of Patent: *Jul. 14, 2015

(54) INVERTED ORTHOGONAL SPIN TRANSFER LAYER STACK

(71) Applicant: New York University, New York, NY (US)

(72) Inventors: Andrew Kent, New York, NY (US); Dirk Backes, New York, NY (US)

(73) Assignee: New York University, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/053,448

(22) Filed: Oct. 14, 2013

(65) Prior Publication Data

US 2014/0103472 A1    Apr. 17, 2014

Related U.S. Application Data

(60) Provisional application No. 61/715,111, filed on Oct. 17, 2012.

(51) Int. Cl.
  *G11B 5/39*    (2006.01)
  *H01L 37/00*   (2006.01)
  (Continued)

(52) U.S. Cl.
  CPC ............... *H01L 37/00* (2013.01); *B82Y 40/00* (2013.01); *G11C 11/16* (2013.01); *H01F 10/3286* (2013.01); *H01F 41/307* (2013.01); *H01L 43/08* (2013.01); *H01F 10/3272* (2013.01)

(58) Field of Classification Search
  CPC .. G11C 11/16; G11C 11/161; H01F 10/3254; H01F 10/3268

USPC .................................. 257/295, 421, E21.665
See application file for complete search history.

(56) References Cited

U.S. PATENT DOCUMENTS 5,541,868 A    7/1996 Prinz
5,629,549 A    5/1997 Johnson
(Continued)

FOREIGN PATENT DOCUMENTS

CA    2766141       1/2011
EP    1 345 277 A1  9/2003
(Continued)

OTHER PUBLICATIONS

U.S. Appl. No. 14/053,455.*
(Continued)

*Primary Examiner* — John C Ingham
(74) *Attorney, Agent, or Firm* — Foley & Lardner LLP

(57) ABSTRACT

A magnetic device includes a pinned magnetic layer having a first fixed magnetization vector with a first fixed magnetization direction. The magnetic device also includes a free magnetic layer having a variable magnetization vector having at least a first stable state and a second stable state. The magnetic device also has a first non-magnetic layer and a reference. The first non-magnetic layer spatially separates the pinned magnetic layer and the free magnetic layer. The magnetic device also includes a second non-magnetic layer spatially separating the free magnetic layer and the reference magnetic layer. A magnetic tunnel junction, located below the pinned magnetic layer, is formed by the free magnetic layer, the second non-magnetic layer, and the reference magnetic layer. Application of a current pulse, having either positive or negative polarity and a selected amplitude and duration, through the magnetic device switches the variable magnetization vector.

20 Claims, 10 Drawing Sheets

(51) Int. Cl.
*G11C 11/16* (2006.01)
*H01L 43/08* (2006.01)
*H01F 41/30* (2006.01)
*B82Y 40/00* (2011.01)
*H01F 10/32* (2006.01)

(56) References Cited

U.S. PATENT DOCUMENTS

| | | | |
|---|---|---|---|
| 5,640,343 A | 6/1997 | Gallagher et al. | |
| 5,654,566 A | 8/1997 | Johnson | |
| 5,691,936 A | 11/1997 | Sakakima et al. | |
| 5,695,846 A | 12/1997 | Lange et al. | |
| 5,695,864 A | 12/1997 | Slonczewski | |
| 5,856,897 A | 1/1999 | Mauri | |
| 5,896,252 A | 4/1999 | Kanai | |
| 5,966,323 A | 10/1999 | Chen et al. | |
| 6,016,269 A | 1/2000 | Peterson et al. | |
| 6,055,179 A | 4/2000 | Koganei et al. | |
| 6,124,711 A | 9/2000 | Tanaka et al. | |
| 6,134,138 A | 10/2000 | Lu et al. | |
| 6,140,838 A | 10/2000 | Johnson | |
| 6,154,349 A | 11/2000 | Kanai et al. | |
| 6,172,902 B1 | 1/2001 | Wegrowe et al. | |
| 6,233,172 B1 | 5/2001 | Chen et al. | |
| 6,243,288 B1 | 6/2001 | Ishikawa et al. | |
| 6,252,798 B1 | 6/2001 | Satoh et al. | |
| 6,256,223 B1 | 7/2001 | Sun | |
| 6,272,036 B1 | 8/2001 | You et al. | |
| 6,292,389 B1 | 9/2001 | Chen et al. | |
| 6,347,049 B1 | 2/2002 | Childress et al. | |
| 6,376,260 B1 | 4/2002 | Chen et al. | |
| 6,385,082 B1 | 5/2002 | Abraham et al. | |
| 6,436,526 B1 | 8/2002 | Odagawa et al. | |
| 6,493,197 B2 | 12/2002 | Ito et al. | |
| 6,522,137 B1 | 2/2003 | Sun et al. | |
| 6,532,164 B2 | 3/2003 | Redon et al. | |
| 6,538,918 B2 | 3/2003 | Swanson et al. | |
| 6,545,906 B1 | 4/2003 | Savtchenko et al. | |
| 6,563,681 B1 | 5/2003 | Sasaki et al. | |
| 6,603,677 B2 | 8/2003 | Redon et al. | |
| 6,653,154 B2 | 11/2003 | Doan et al. | |
| 6,654,278 B1 | 11/2003 | Engel et al. | |
| 6,710,984 B1 | 3/2004 | Yuasa et al. | |
| 6,713,195 B2 | 3/2004 | Wang et al. | |
| 6,714,444 B2 | 3/2004 | Huai et al. | |
| 6,744,086 B2 | 6/2004 | Daughton et al. | |
| 6,750,491 B2 | 6/2004 | Sharma et al. | |
| 6,765,824 B2 | 7/2004 | Kishi et al. | |
| 6,773,515 B2 | 8/2004 | Li et al. | |
| 6,777,730 B2 | 8/2004 | Daughton et al. | |
| 6,812,537 B2 | 11/2004 | Okazawa et al. | |
| 6,829,161 B2 | 12/2004 | Huai et al. | |
| 6,835,423 B2 | 12/2004 | Chen et al. | |
| 6,838,740 B2 | 1/2005 | Huai et al. | |
| 6,842,317 B2 | 1/2005 | Sugita et al. | |
| 6,847,547 B2 | 1/2005 | Albert et al. | |
| 6,888,742 B1 | 5/2005 | Nguyen et al. | |
| 6,902,807 B1 | 6/2005 | Argoitia et al. | |
| 6,906,369 B2 | 6/2005 | Ross et al. | |
| 6,920,063 B2 | 7/2005 | Huai et al. | |
| 6,933,155 B2 | 8/2005 | Albert et al. | |
| 6,958,927 B1 | 10/2005 | Nguyen et al. | |
| 6,967,863 B2 | 11/2005 | Huai | |
| 6,980,469 B2 | 12/2005 | Kent et al. | |
| 6,985,385 B2 | 1/2006 | Nguyen et al. | |
| 6,992,359 B2 | 1/2006 | Nguyen et al. | |
| 6,995,962 B2 | 2/2006 | Saito et al. | |
| 7,002,839 B2 | 2/2006 | Kawabata et al. | |
| 7,005,958 B2 | 2/2006 | Wan | |
| 7,009,877 B1 | 3/2006 | Huai et al. | |
| 7,170,778 B2 | 1/2007 | Kent et al. | |
| 7,190,611 B2 | 3/2007 | Nguyen et al. | |
| 7,203,129 B2 | 4/2007 | Lin et al. | |
| 7,227,773 B1 | 6/2007 | Nguyen et al. | |
| 7,262,941 B2 | 8/2007 | Li et al. | |
| 7,307,876 B2 | 12/2007 | Kent et al. | |
| 7,573,737 B2 * | 8/2009 | Kent et al. | 365/173 |
| 8,279,666 B2 | 10/2012 | Deiny et al. | |
| 8,547,731 B2 * | 10/2013 | Higo et al. | 365/158 |
| 2001/0033467 A1 | 10/2001 | Engel et al. | |
| 2002/0090533 A1 | 7/2002 | Zhang et al. | |
| 2002/0105823 A1 | 8/2002 | Redon et al. | |
| 2003/0117840 A1 | 6/2003 | Sharma et al. | |
| 2003/0151944 A1 | 8/2003 | Saito | |
| 2003/0197984 A1 | 10/2003 | Inomata et al. | |
| 2003/0218903 A1 | 11/2003 | Luo | |
| 2004/0012994 A1 | 1/2004 | Slaughter et al. | |
| 2004/0094785 A1 | 5/2004 | Zhu et al. | |
| 2004/0130936 A1 | 7/2004 | Nguyen et al. | |
| 2004/0257717 A1 | 12/2004 | Sharma | |
| 2005/0041342 A1 | 2/2005 | Huai et al. | |
| 2005/0063222 A1 | 3/2005 | Huai et al. | |
| 2005/0104101 A1 | 5/2005 | Sun et al. | |
| 2005/0128842 A1 | 6/2005 | Wei | |
| 2005/0136600 A1 | 6/2005 | Huai | |
| 2005/0158881 A1 | 7/2005 | Sharma | |
| 2005/0180202 A1 | 8/2005 | Huai et al. | |
| 2005/0184839 A1 | 8/2005 | Nguyen et al. | |
| 2005/0201023 A1 | 9/2005 | Huai et al. | |
| 2005/0237787 A1 | 10/2005 | Huai et al. | |
| 2005/0280058 A1 | 12/2005 | Pakala et al. | |
| 2006/0018057 A1 | 1/2006 | Huai | |
| 2006/0049472 A1 | 3/2006 | Diao et al. | |
| 2006/0092696 A1 | 5/2006 | Bessho | |
| 2006/0132990 A1 | 6/2006 | Morise et al. | |
| 2006/0227465 A1 | 10/2006 | Inokuchi et al. | |
| 2007/0019337 A1 | 1/2007 | Apalkov et al. | |
| 2007/0242501 A1 | 10/2007 | Hung et al. | |
| 2008/0049488 A1 | 2/2008 | Rizzo | |
| 2008/0112094 A1 | 5/2008 | Kent et al. | |
| 2008/0259508 A2 | 10/2008 | Kent et al. | |
| 2008/0297292 A1 | 12/2008 | Viala et al. | |
| 2009/0072185 A1 | 3/2009 | Raksha et al. | |
| 2009/0098413 A1 | 4/2009 | Kanegae | |
| 2009/0141540 A1 | 6/2009 | Miura et al. | |
| 2010/0028530 A1 * | 2/2010 | Parkin | 427/130 |
| 2010/0124091 A1 | 5/2010 | Cowburn | |
| 2010/0140726 A1 | 6/2010 | Apalkov et al. | |
| 2010/0226169 A1 | 9/2010 | Gao et al. | |
| 2010/0271870 A1 | 10/2010 | Zheng et al. | |
| 2011/0007560 A1 | 1/2011 | Dieny et al. | |
| 2011/0141791 A1 | 6/2011 | Ahmed | |
| 2011/0316103 A1 * | 12/2011 | Uchida et al. | 257/421 |
| 2012/0069649 A1 | 3/2012 | Ranjan et al. | |
| 2012/0261776 A1 | 10/2012 | Tang et al. | |
| 2013/0075845 A1 | 3/2013 | Chen et al. | |
| 2014/0008742 A1 | 1/2014 | Chen et al. | |

FOREIGN PATENT DOCUMENTS

| | | |
|---|---|---|
| FR | 2817998 | 6/2002 |
| FR | 2832542 | 5/2003 |
| FR | 2910716 | 6/2008 |
| JP | 10-004012 A | 1/1998 |
| JP | 11-120758 | 4/1999 |
| JP | 11-353867 | 12/1999 |
| JP | 2002-261352 | 9/2002 |
| JP | 2002-357489 | 12/2002 |
| JP | 2003-318461 | 11/2003 |
| JP | 2005-150482 | 6/2005 |
| JP | 2005-535111 | 11/2005 |
| JP | 2006-128579 | 5/2006 |
| JP | 2007-525005 | 8/2007 |
| JP | 2008-177421 | 7/2008 |
| JP | 2008-524830 A | 7/2008 |
| JP | 2009-027177 | 2/2009 |
| JP | 2001195878 | 7/2011 |
| WO | WO-2009/080636 | 7/2009 |
| WO | WO2011/005484 A2 | 1/2011 |

OTHER PUBLICATIONS

Office Action for Canadian application No. 2,766,141 dated May 22, 2014, 3 pages.

(56) References Cited

OTHER PUBLICATIONS

Decision of Rejection dated Mar. 18, 2014 for Japanese App. No. 2012-043157, 5 pages.
Firastrau et al., "Spin-torque nano-oscillator based on a synthetic antiferromagnet free layer and perpendicular to plane polarizer", J. App. Phys. 113, 113908 (2013).
Stiles et al., "Spin-Transfer Torque and Dynamic", Spin Dynamics in Confined Magnetic Structures III, Topics in Applied Physics vol. 101, pp. 225-308 (206).
Office Action dated May 13, 2014, for U.S. Appl. No. 13/919,466, 20 pages.
R.H. Koch, et al. Physical Review Letters, vol. 84, No. 23, Jun. 2000 *Thermally Assisted Magnetization Reversal in Submicron-Sized Magnetic Thin Films*, pp. 5419-5422.
Lee et al., Analytical investigation of spin-transfer dynamics using a perpendicular-to-plane polarizer, Applied Physics Letters 86, pp. 022505-1 to 022505-3 (2005).
US 7,026,672, 04/2006, Pakala et al. (withdrawn).
First Office Action (with English Translation) in Japanese Patent Application No. 2006-524031, dated May 10, 2011, (8 pgs.).
Martens et al., "Magnetic Reversal in nanoscopic Ferromagnetic Rings", NSF grants PHY-0351964 (DLS), 2006, 23 pages.
Martens et al., "Thermally Induced Magnetic Switching in Thin Ferromagnetic Annuli", NSF grants PHY-0351964 (DLS), 2005, 11 pages.
Non-Final Office Action for U.S. Appl. No. 13/298,190, dated Jul. 2, 2013, (20 pgs.).
Non-Final Office Action on U.S. Appl. No. 13/720,290, dated May 14, 2013, (20 pgs.).
Notice of Allowance for U.S. Appl. No. 13/720,290, mailed Sep. 12, 2013.
Notice of Allowance on U.S. Appl. No. 12/490,588, dated Feb. 3, 2011, (11 pgs.).
Notice of Allowance on U.S. Appl. No. 13/041,104, dated Sep. 21, 2012, (7pgs.).
Notice of Reasons for Rejection received for JP 2012-043157 dated Sep. 3, 2013.
Notification of Provisional Rejection received for Korean Appl. No. 10-2012-7001872 mailed Jun. 7, 2013.
Notification of Reasons for Refusal received in Japanese Appl. No. 2012-517632 dated Jul. 17, 2013.
Office Action for Canadian Application No. 2,766,141, dated Sep. 4, 2013, 4 pages.
Office Action issued by the Chinese Patent Office, Oct. 29, 2012, Chinese Application No. 200880119942.4, 10 pages.
Office Action on U.S. Appl. No. 13/041,104, dated Apr. 6, 2012, (17 pgs.).
Office Action received for JP 2010-531338 dated Jun. 18, 2013.
PCT International Search Report and Written Opinion on Int'l. Application No. PCT/US2010/039373, dated Jan. 5, 2011, (5 pgs.).
Supplementary European Search Report received for EP 10797550.0 completed Jul. 22, 2013 and mailed Sep. 16, 2013.
US Notice of Allowance for U.S. App. No. 13/298,190, dated Sep. 30, 2013.
Notification of Transmittal of the International Search Report and the Written Opinion of the International Searching Authority, or the Declaration for PCT/US2013/065055, dated Jan. 30, 2014, 7 pages.
Notice of Allowance received for U.S. Appl. No. 13/298,190 dated Sep. 20, 2013.
Notification of Provisional Rejection for Korean App. No. 10-2013-7023576 dated Oct. 30, 2013, 46 pages.
Notice of Allowance for U.S. Appl. No. 13/298,190 dated Oct. 28, 2013, 8 pages.
Petition for *Inter Partes* Review of U.S. Patent No. 6,980,469, IPR2014-00047, dated Oct. 10, 2013, 62 pages.
Declaration of Sanjay K. Banerjee, Ph.D., *Inter Partes* Review of U.S. Patent No. 6,980,469, IPR2014-00047, dated Oct. 9, 2013, 288 pages.
Observations by a third party concerning patentability in European App. No. 04781554.3 dated Dec. 13, 2013, 3 pages.
New York University's Patent Owner Preliminary Response, IPR2014-00047, dated Jan. 17, 2014, 59 pages.
Second Notification of Provisional Rejection for Korean Patent Application No. 10-2012-7001872, dated Dec. 30, 2013, 37 pages.
Notification of the Third Office Action for Chinese App. No. 200880119942.4 dated Dec. 16, 2013, 5 pages.
Notification of Transmittal of the International Search Report and the Written Opinion of the International Searching Authority, or the Declaration, for PCT/US2013/064975, dated Jan. 30, 2014, 7 pages.
Ingvarsson, S., et al., "Tunable magnetization damping in transition metal ternary alloys", Applied Physics Letters, vol. 85, No. 21, Nov. 22, 2004., pp. 4995-4997.
Office Action for Canada App. No. 2,535,965, dated Dec. 12, 2014, 3 pages.
Notification of Provisional Rejection for Korean App. No. 10-2010-7011550, dated Dec. 10, 2014, 6 pages.
Notification of Reasons of Refusal for Japanese App. No. 2013-257366, dated Dec. 3, 2014, 3 pages.
Office Action for U.S. Appl. No. 14/053,455 dated Sep. 25, 2014, 26 pages.
Notification of Reasons for Refusal in Japanese Patent Application No. 2013-257367, dated Feb. 12, 2015 with English Translation, 6 pages.
European Extended Search Report for Application No. 14198308.0, dated Apr. 8, 2015, 4 pages.
Japanese Final Office Action with English translation for Appl. No. 2013-257366, Dated Mar. 30, 2015, 3 pages.

\* cited by examiner

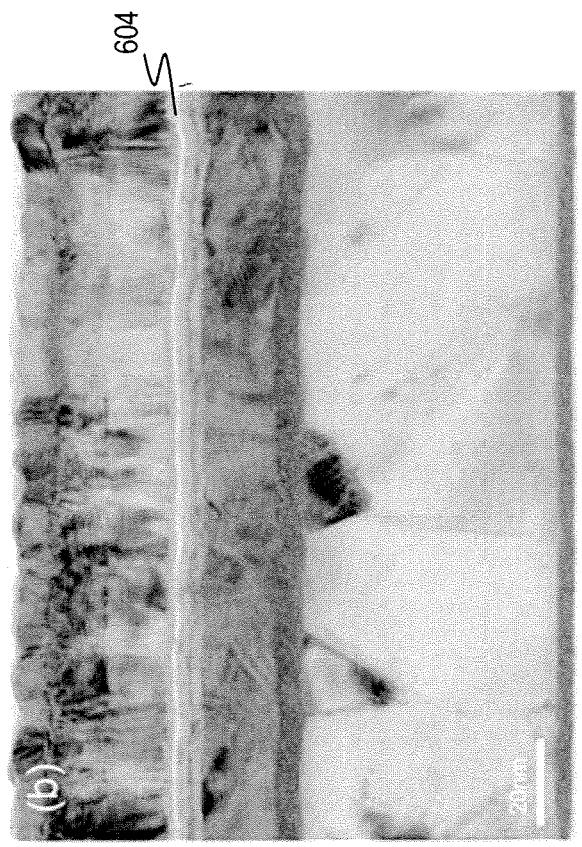
Fig. 6B
Fig. 6A
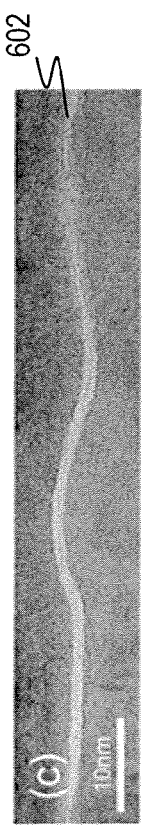
Fig. 6D
Fig. 6C

INVERTED ORTHOGONAL SPIN TRANSFER LAYER STACK

CROSS REFERENCE TO RELATED APPLICATIONS

This application claims the benefit of U.S. Provisional Patent Application No. 61/715,111, filed on Oct. 17, 2012, which is incorporated by reference herein in its entirety.

BACKGROUND

Orthogonal spin transfer magnetic random access devices (OST-MRAM™) incorporate a polarizer. The devices and layer stacks are discussed in U.S. Pat. No. 6,980,469, the entirety of which is incorporated by reference. Roughness within and near the magnetic tunnel junction of a layer stack impacts performance of the OST™ device. Increased roughness can negatively impact the breakdown of the magnetic tunnel junction. An OST™ layer stack with the polarizer on the top of the stack can reduce the roughness of the magnetic tunnel junction, increase the device magnetoresistance, and improve the performance of OST™ memory devices.

SUMMARY

In general, one aspect of the subject matter described in this specification is embodied in a magnetic device that includes a pinned magnetic layer having a first fixed magnetization vector with a first fixed magnetization direction. The magnetic device also includes a free magnetic layer having a variable magnetization vector having at least a first stable state and a second stable state. The magnetic device also has a first non-magnetic layer and a reference. The first non-magnetic layer spatially separates the pinned magnetic layer and the free magnetic layer. The reference magnetic layer has a second fixed magnetization vector with a second fixed magnetization direction. The magnetic device also includes a second non-magnetic layer spatially separating the free magnetic layer and the reference magnetic layer. A magnetic tunnel junction is formed by the free magnetic layer, the second non-magnetic layer, and the reference magnetic layer. Application of a current pulse, having either positive or negative polarity and a selected amplitude and duration, through the magnetic device switches the variable magnetization vector. The magnetic tunnel junction is spatially located below the pinned magnetic layer. Other implementations of memory devices and memory systems are described in greater detail below.

The foregoing summary is illustrative only and is not intended to be in any way limiting. In addition to the illustrative aspects, implementations, and features described above, further aspects, implementations, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

FIGS. 6A and 6C are transmission electron microscope cross sections of a non-inverted layer stack.

FIGS. 6B and 6D are transmission electron microscope cross sections of an inverted layer stack in accordance with an illustrative implementation.

Figure 1:
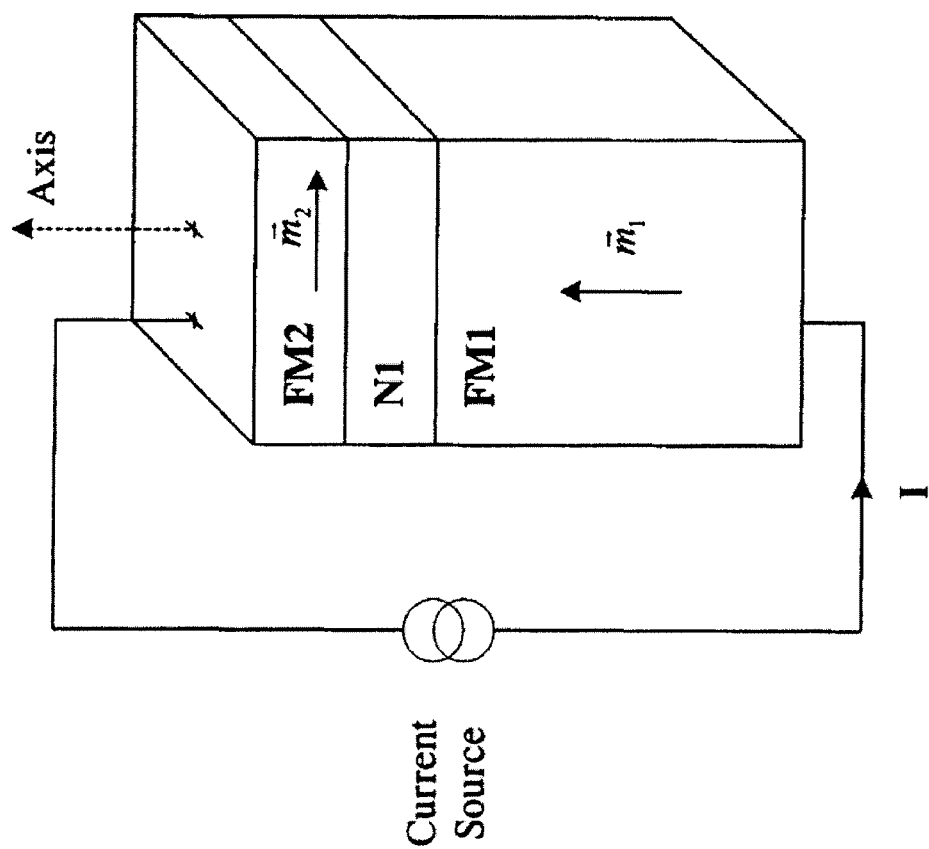
FIG. 1 is an illustration of a magnetic device.

All numerical thicknesses illustrated in the figures are nanometers (nm). Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Structure of a Basic Magnetic Device

FIG. 1 shows a prior art multilayered, pillar-shaped magnetic device comprising a pinned magnetic layer FM1 with a fixed magnetization direction and a free magnetic layer FM2 with a free magnetization direction. $m_1$ is the magnetization vector of the pinned magnetic layer FM1, and $m_2$ is the magnetization vector of the free magnetic layer FM2. The pinned magnetic layer FM1 acts as a source of spin angular momentum.

The pinned magnetic layer FM1 and the free magnetic layer FM2 are separated by a first non-magnetic layer N1 that spatially separates the two layers FM1 and FM2. N1 may be a non-magnetic metal (Cu, CuN, Cr, Ag, Au, Al, Ru, Ta, TaN, etc.) or a thin non-magnetic insulator such as $Al_2O_3$ or MgO. When N1 is a non-magnetic metal its thickness must be less or approximately equal to the spin-diffusion length in the material at the temperature of the device. This allows the electron spin-polarization to be substantially maintained as electrons traverse N1. In one implementation where Cu is used, the thickness of the layer be less than or approximately equal to 0.5 to 50 nm for a device operating at or near room temperature. When N1 is an insulating layer, its thickness must be such that electrons can traverse this layer by quantum mechanical tunneling and mainly preserve their direction of spin-polarization in this process. In an implementation where N1 is MgO or $Al_2O_3$, the layer should be approximately equal to 0.3 to 4 nm in thickness. The thickness of the non-magnetic layer N1 should be such there is an absence of scattering of the electron spin-direction on a short length scale, which is less than about the layer thickness. The pillar-shaped magnetic device is typically sized in nanometers, e.g., it may be less than approximately 200 nm laterally.

The free magnetic layer FM2 is essentially a magnetic thin film element imbedded in a pillar-shaped magnetic device with two additional layers—the pinned magnetic layer FM1 and the non-magnetic layer N1. The layer thicknesses are typically approximately 0.7 nm to 10 nm.

These pillar-shaped magnetic devices can be fabricated in a stacked sequence of layers by many different means, including physical vapor deposition (sputtering), thermal and electron-beam evaporation through a sub-micron stencil mask. These magnetic devices can also be fabricated in a stack sequence using sputtering, thermal and electron-beam evaporation to form a multilayered film followed by a subtractive nanofabrication process that removes materials to leave the pillar-shaped magnetic device on a substrate surface, such as that of a silicon of other semiconducting or insulating wafer. The semiconducting wafer may already include portions of the CMOS circuitry for reading and writing the magnetic device. Annealing may be used when the layer stack incorporates a magnetic tunnel junction. Annealing can crystallize an MgO insulating barrier and enhance the junction magnetoresistance. In various implementations, a single annealing process is used. In one implementation, the stacks are annealed at a temperature of 300 C to 450 C to thermally crystallize the MgO layer. The duration of the annealing is minutes (a rapid thermal anneal) to several hours, with higher annealing temperatures requiring shorter annealing times. The annealing is often done in a magnetic field of 1 Tesla or greater to set the magnetic state of the reference layer (FM3). The annealing provides a preferred direction of magnetic anisotropy and an enhanced uniaxial magnetic anisotropy of the free layer (FM2).

Materials for the ferromagnetic layers include (but are not limited to) Fe, Co, Ni; alloys of these elements, such as $Ni_{1-x}Fe_x$ and CoFe; alloys of these ferromagnetic metals with non-magnetic metals, such as B, Cu, V, Pd, and Pt at compositions in which the materials are ferromagnetically ordered at room temperature; conducting materials; conducting magnetic oxides such as $CrO_2$ and $Fe_3O_4$; and fully spin-polarized materials such as the Heusler alloy NiMnSb. For the nonmagnetic layers, materials include (but are not limited to) Cu, CuN, Cr, Ag, Au, Al, Ru, Ta, and TaN.

An electric current source is connected to the pinned magnetic layer FM1 and the free magnetic layer FM2 so that an electric current, I, can traverse the pillar device. In another implementation, an electrical contact is made to the top and bottom of a pillar that incorporates the layer stack.

Figure 2:
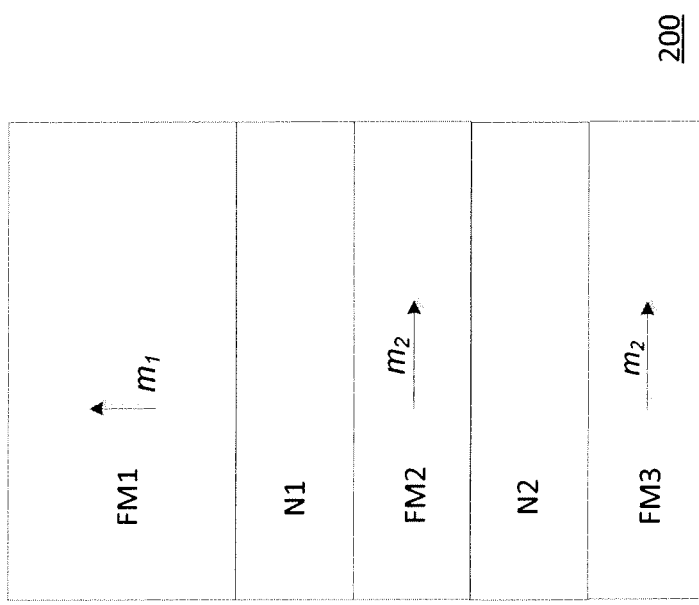
FIG. 2 is an illustration of a magnetic device with an inverted layer stack in accordance with an illustrative implementation.

FIG. 2 is an illustration of an inverted layer stack 200 in accordance with an illustrative implementation of the invention. In this implementation, the inverted layer stack 200 contains a pinned layer FM1. The pinned layer FM1 can be magnetized perpendicular to the plane of the layer, and is represented by $m_1$ in FIG. 2. The pinned layer FM1 can be inverted with respect to the free magnetic layer FM2. In other words, the pinned layer FM1 is formed after the free magnetic layer FM2 and the reference layer FM3. A non-magnetic layer N1 separates the pinned layer FM1 and the free magnetic layer FM2. The free magnetic layer FM2 can form a magnetic tunnel junction with another non-magnetic layer N2 as the insulator of the magnetic tunnel junction and the reference layer FM3. N1 can also be an insulating layer so that FM1 and FM2 form a second magnetic tunnel junction. The reference layer FM3 can be used to read the state of a device. The reference layer FM3 is separated from the free magnetic layer FM2 by a non-magnetic layer N2. Various materials, as described above in greater detail, can be used to make the various layers of the inverted layer stack 200. In addition, the layers can be of various different thicknesses.

Figure 3:
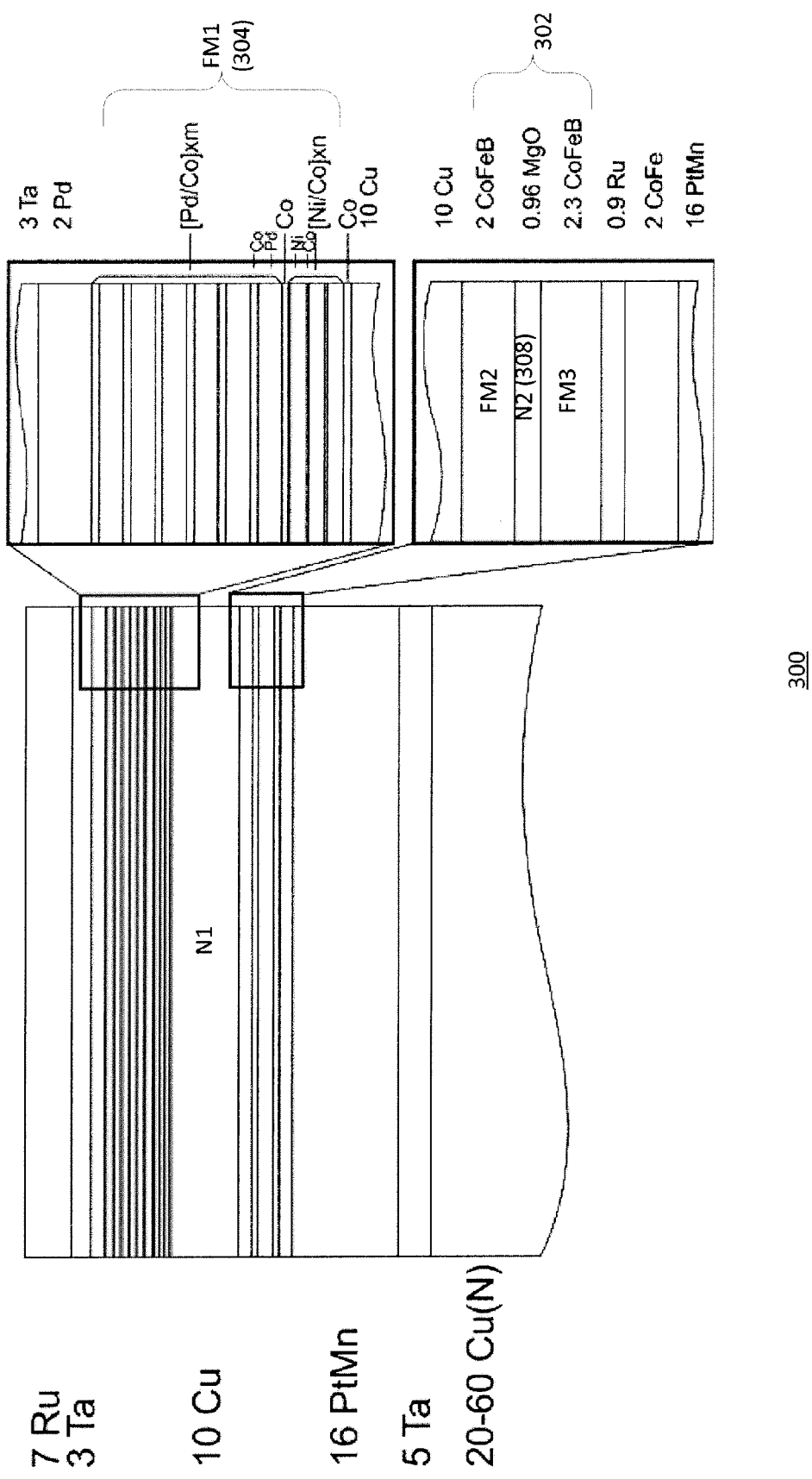
FIG. 3 is an illustration of an inverted layer stack with the polarizer (FM1) at the top of the stack in accordance with an illustrative implementation.

FIG. 3 is an illustration of an inverted layer stack 300 in accordance with an illustrative implementation. The thickness of the various layers are in nanometers (nm). In addition the FM1, FM2, FM3, N1, and N2 layers that are related to the layers of those in FIG. 2 are shown. In the inverted stack 300, the magnetic tunnel junction layer 302 is at the bottom and the perpendicular polarizer 304 at the top. In some implementations, the polarizer is deposited on top of the magnetic tunnel junction, which is made up of the FM2, N2, and FM3 layers. In the inverted stack 300, the magnetic tunnel junction layer 302 are closer to a substrate or a semiconductor device (CMOS) wafer. The magnetic tunnel junction layer 302 are also smoother compared to the magnetic tunnel junction layers of a non-inverted layer stack with the polarizer at the bottom, e.g., FIG. 1. The increase of smoothness i.e., a reduction of roughness, of the magnetic tunnel junction layer 302 reduces sharp corners within the magnetic tunnel junction layer 302 and surrounding layers. Specifically, the smoothness of a second non-magnetic layer N2 (308) is increased when compared to a second non-magnetic layer of a non-inverted layer stack. Roughness within an insulating layer impacts when and under what circumstances the magnetic tunnel breaks down. The inverted stack 300 has a smoother non-magnetic layer 308 that improves performance of orthogonal spin transfer MRAM devices by increasing the breakdown voltage and improving magnetic switching characteristics when compared to orthogonal spin transfer MRAM devices that use a non-inverted layer stack. The inverted stack 300 also can reduce variations in device properties across a wafer. The Cu(N) layer is an optional layer and in various implementations, this layer is not present. The Cu(N) layer forms an electrical contact to a device. This contact can be part of the substrate, e.g., the CMOS drivers. The Cu(N) layer can also be made of different materials, such as, but not limited to, Al, Ta, Cu.

FIGS. 6A-6D illustrate the difference in smoothness of the magnetic tunnel junction layers between an inverted stack and a non-inverted layer stack. FIGS. 6A and 6C are transmission electron microscope cross sections of a non-inverted layer stack. A second non-magnetic layer MgO 602 can be seen at two different scales in FIGS. 6A and 6C. FIGS. 6B and 6D are transmission electron microscope cross sections of an inverted layer stack in accordance with an illustrative implementation. A second non-magnetic layer MgO 604 can be seen at two different scales in FIGS. 6B and 6D. As can be seen in comparing FIGS. 6A and 6C with FIGS. 6B and 6D, the second non-magnetic layer 604 is smoother than the second non-magnetic layer 602. The amplitude of the roughness of the MgO layer was reduced from 2.9+/−2.7 nanometers (nm) in the non-inverted layer stack to 0.8+/−0.3 nm in the inverted layer stack. Here, the amplitude is defined as the vertical distance between minima and maxima. The wavelength of the roughness of the MgO layer was also reduced from 33.1+/−11.0 nm in the non-inverted layer stack to 23.2+/−14.6 nm in the inverted stack. Here, the wavelength is defined as twice the horizontal distance between the minima and maxima and maxima and minima, respectively. The reduced roughness results in a higher device breakdown voltage that leads to a larger separation between the write voltage and the breakdown voltage. This leads to a higher performance device that has fewer device failures during operation.

Figure 4:
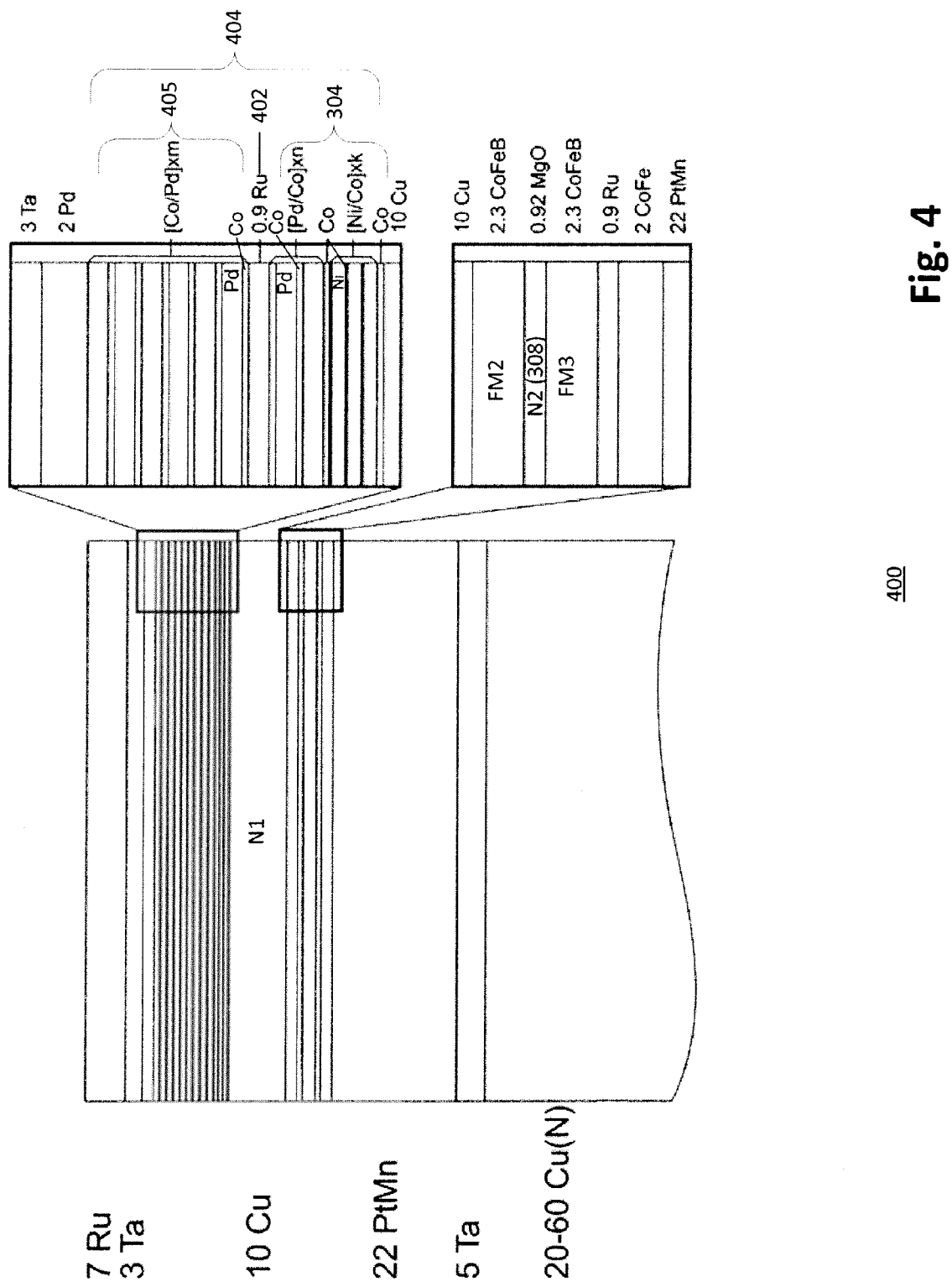
FIG. 4 is an illustration of an inverted layer stack with a synthetic antiferromagnet polarizer in accordance with an illustrative implementation.

Other inverted stacks can be produced with additional layers. FIG. 4 is an illustration of an inverted layer stack 400 with a synthetic antiferromagnet polarizer 404 in accordance with an illustrative implementation. The inverted layer stack 400 is similar to the inverted layer stack 300 illustrated in FIG. 3. The difference is that the perpendicular polarizer 304 is incorporated into a synthetic antiferromagnet 404. A thin antiferromagnetic coupling layer 402 creates an antiparallel magnetic alignment of the two ferromagnetic layers 304 and 405 in the synthetic antiferromagnet. This creates a synthetic antiferromagnet polarizer 404 that includes the perpendicular polarizer 304. In the illustrated example the antiferromagnetic coupling layer is comprised of Ruthenium. In this example, Ruthenium is one of the materials in the synthetic antiferromagnet and is the layer that creates the antiferromagnetic coupling between the Ni/Co and Pd/Co containing layers. In other implementations, other synthetic antiferromagnetic materials can be used, such as, but not limited to, chromium, copper, etc. The Cu(N) layer is an optional layer and in various implementations, this layer is not present.

The synthetic antiferromagnet polarizer 404 reduces the magnetic interactions between the perpendicular polarizer and the free magnetic layer FM2 in the inverted layer stack 400. The reduced magnetic interactions improves device performance, such as, but not limited to, more uniform rotation of the magnetization of the free layer during switching (e.g., writing data); reduction of the likelihood of undesired thermally induced switching events (e.g., fluctuations that erase or corrupt stored data).

Figure 5:
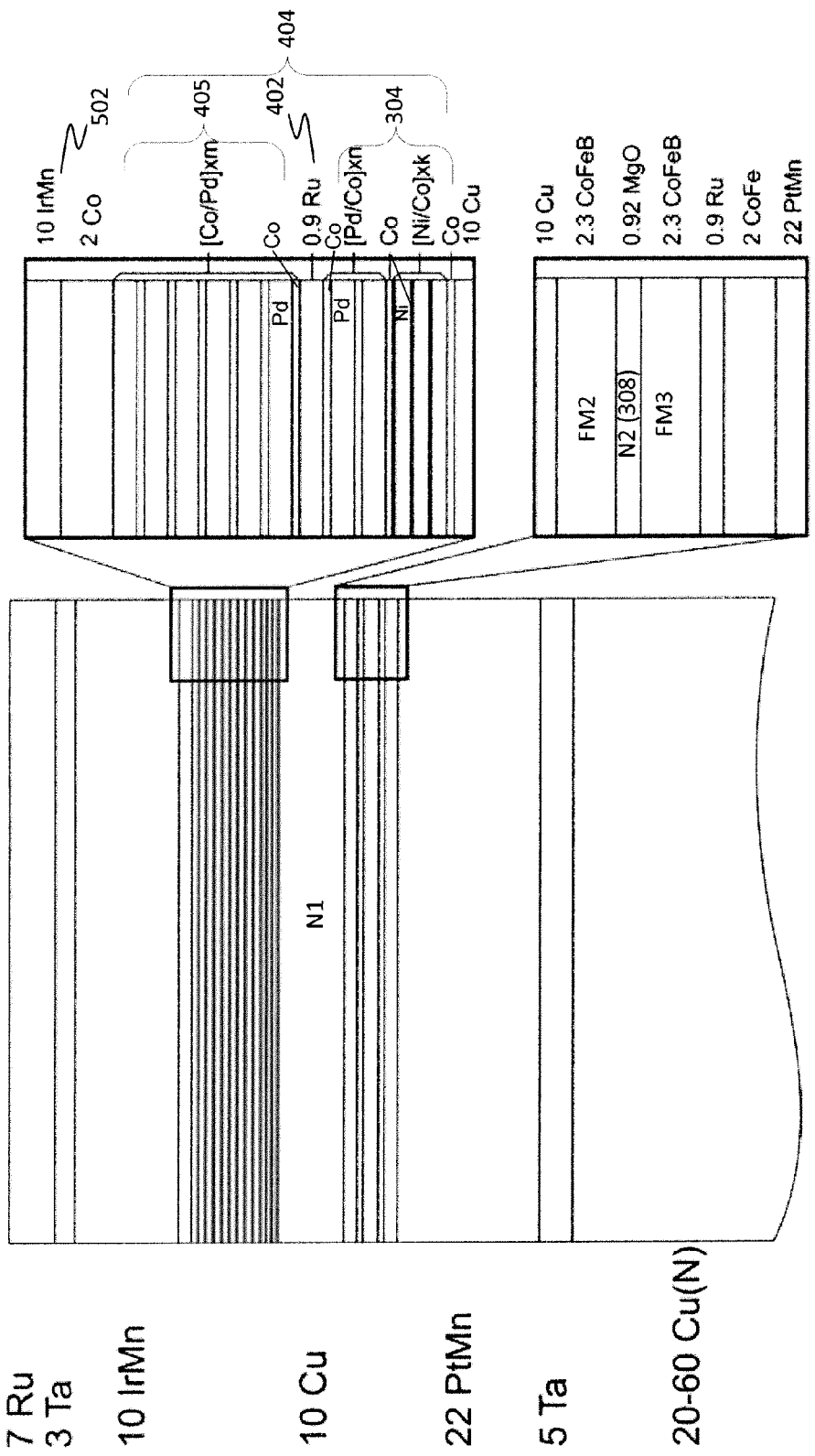
FIG. 5 is an illustration of an inverted layer stack with a pinned synthetic antiferromagnet polarizer in accordance with an illustrative implementation.

FIG. 5 is an illustration of an inverted layer stack 500 with a pinned synthetic antiferromagnet polarizer 404 in accordance with an illustrative implementation. The inverted layer stack 500 is similar to the inverted layer stack 400 illustrated in FIG. 4, but with the addition of a layer of Iridium Manganese 502, an antiferromagnet. In other implementations, other antiferromagnets are used. The addition of the antiferromagnet 502 pins the synthetic antiferromagnetic polarizer 404 giving a perpendicular exchange bias. This makes the perpendicular polarizer 304 magnetically harder and more stable against unwanted demagnetization during usage of a device. This can lead to a longer device life and more repeatable device operation. The Cu(N) layer is an optional layer and in various implementations, this layer is not present.

Figure 7:
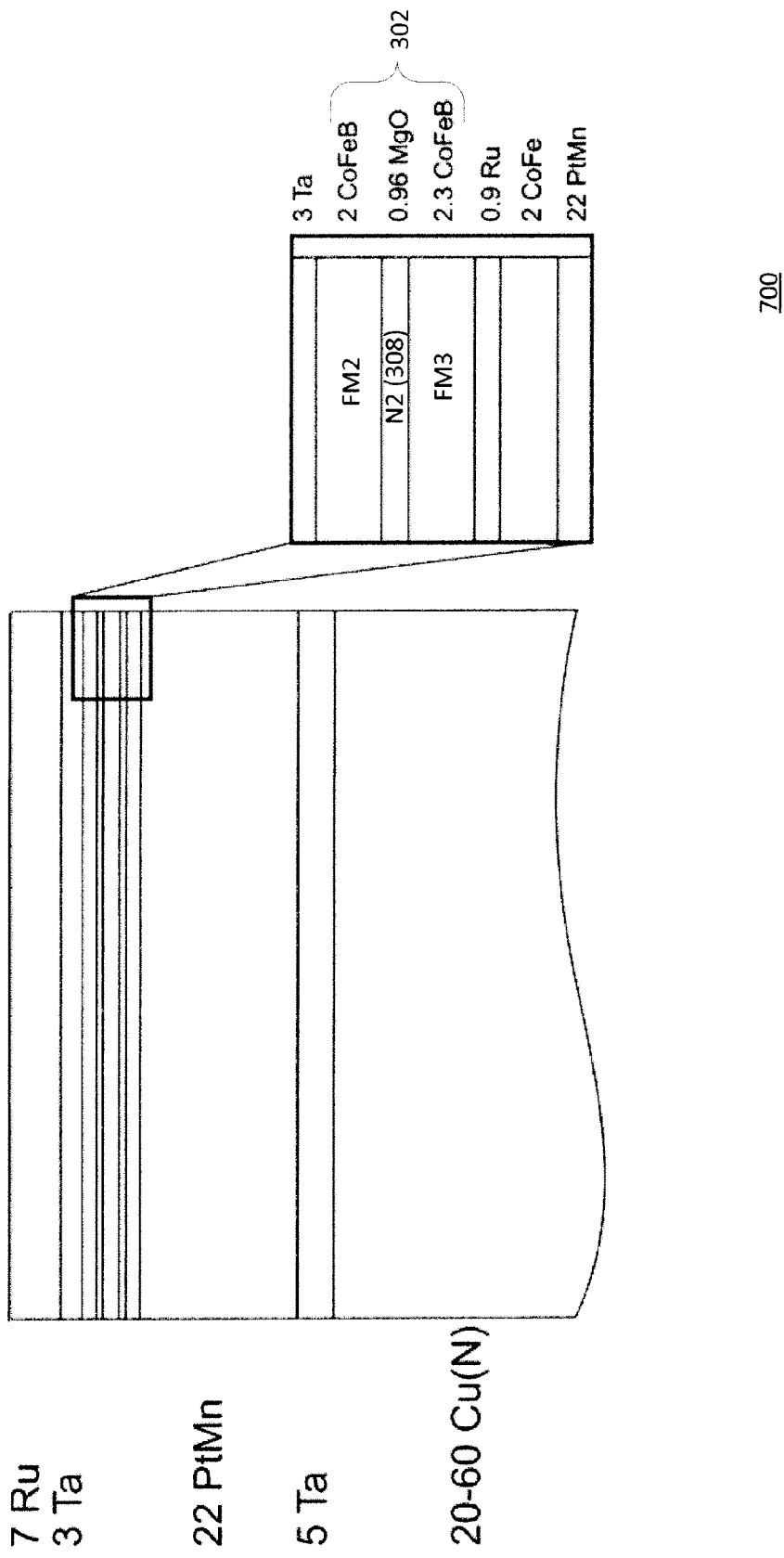
FIG. 7 is an illustration of an inverted magnetic tunnel junction without a polarizer on top in accordance with an illustrative implementation.

In addition to inverting the perpendicular polarizer, changing the materials within the N1 layer can impact the properties of an inverted layer stack. FIG. 7 is an illustration of an inverted magnetic tunnel junction 700 without a polarizer on top in accordance with an illustrative implementation. The Cu(N) layer is an optional layer and in various implementations, this layer is not present. The inverted magnetic tunnel junction 700 contains magnetic tunnel junction layer 302, but there is no perpendicular polarizer. In an experiment, the tunnel magnetoresistance (TMR) was measured using the current in plane tunneling technique (CIPT). A layer stack with Copper at the interface with the CoFeB free layer exhibited a TMR of 55% to 69% depending on the thickness of the MgO layer. In another experiment, the Copper layer was removed. The TMR increased significantly up to 157%. Table 1 below summarizes these findings. The thickness of the MgO layer was not optimized and further increases may be achievable with an optimized MgO layer, but such optimization is not material for operation of the invention.

TABLE 1

| | With Cu Cap | Without Cu Cap |
|---|---|---|
| TMR % | 55-69% | 157% |
| RA Ohm μm² | 2.5-14.4 | 6.18 |

While not limited to the following reason, Copper can induce its face-centered cubic (fcc) crystalline structure into the CoFeB layer with which it shares an interface. For an optimal TMR, a (body-centered cubic) bcc texture of the CoFeB is favorable. The Copper layer can magnetically decouple the polarizer and the magnetic tunnel junction. In these implementations, the Cu/CoFeB interfaces between the Copper interlayer and the CoFeB free layer is the reason for the reduced electric performance, e.g., smaller TMR. Using a bcc texture rather than an fcc structure such as Copper, can increase the TMR of the stack. In addition, using a material that crystallizes at a higher temperature than the CoFeB favors the formation of bcc textured CoFeB and can increase the TMR.

Figure 8:
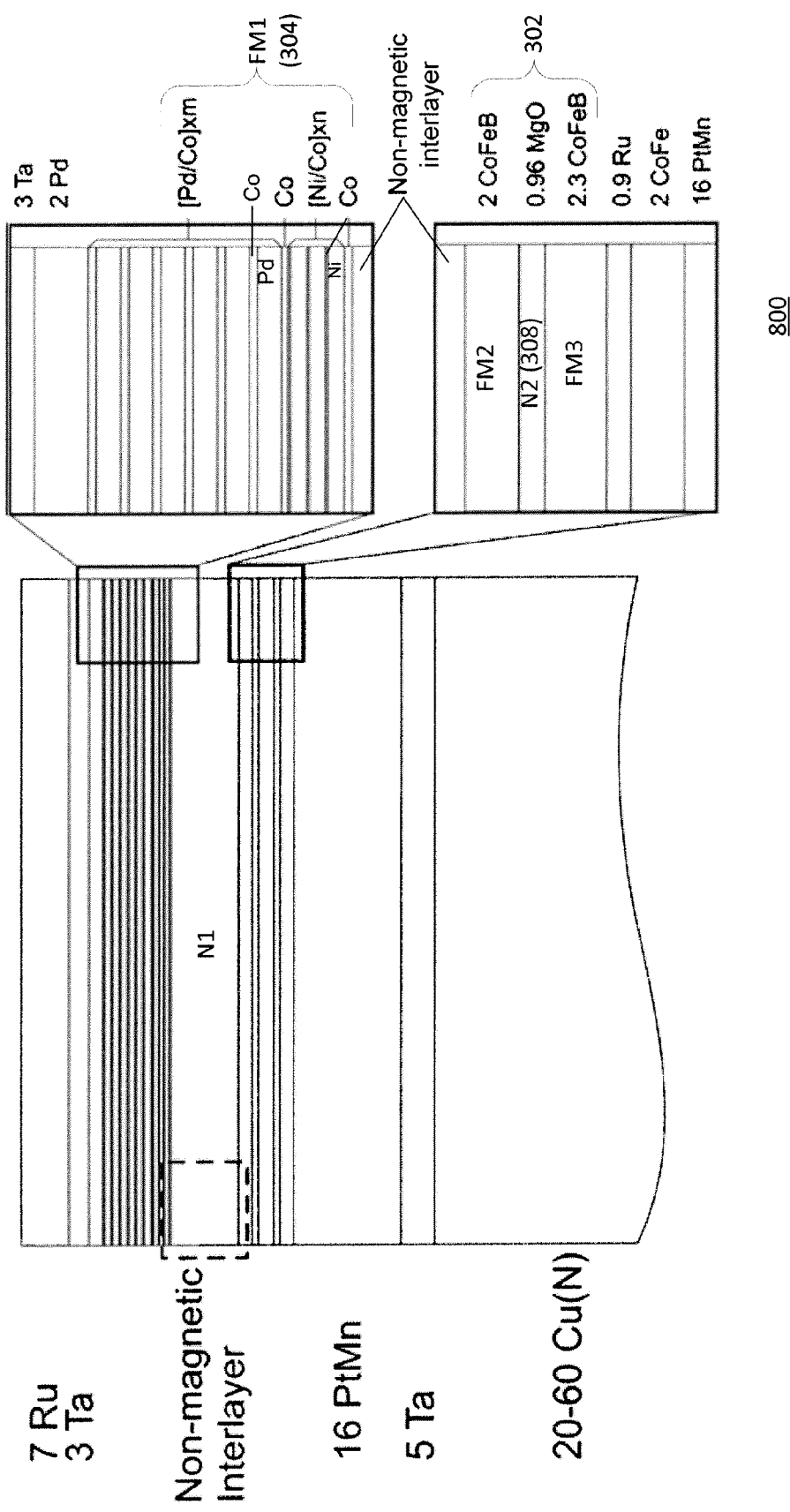
FIG. 8 is an illustration of an inverted layer stack in accordance with an illustrative implementation.
Figure 10:
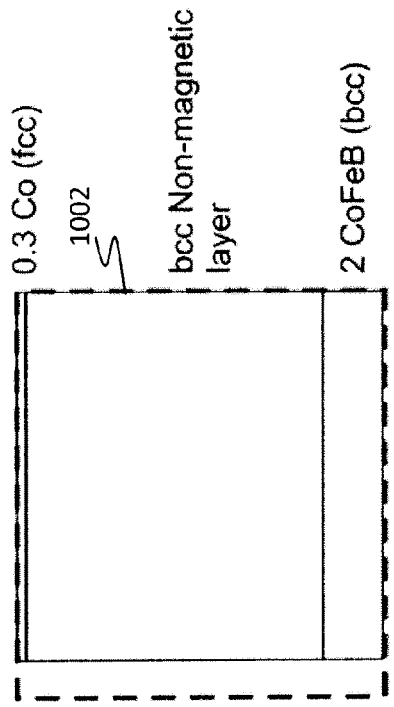
FIG. 10 is an illustration of a bcc non-magnetic layer inverted for use in an inverted stack in accordance with an illustrative implementation.
Figure 9:
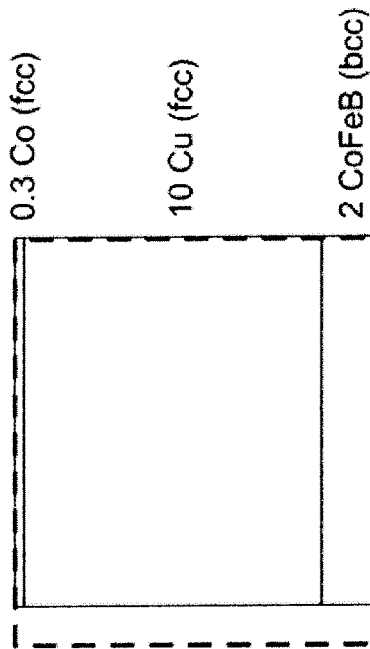
FIG. 9 is an illustration of a fcc non-magnetic layer for use in an inverted layer stack in accordance with an illustrative implementation.

In one implementation, the Copper layer is replaced by a bcc non-magnetic layer. FIG. 8 is an illustration of an inverted layer stack 800 in accordance with an illustrative implementation. The inverted layer stack 800 is similar to the inverted stack 300 of FIG. 3 and contains a non-magnetic layer N1. The materials of this N1 layer can be various materials. The Cu(N) layer is an optional layer and in various implementations, this layer is not present. FIG. 9 illustrates one example where the N1 layer is comprised of Copper. In this example, the inverted layer stack 800 is the same as the inverted stack 300 of FIG. 3. The non-magnetic layer N1, however, can be made of other materials. As described above, replacing Copper, a fcc metal, with a bcc non-magnetic substance the TMR of the inverted layer stack 800 can be increased. FIG. 10 illustrates this example. In FIG. 10, the non-magnetic layer N1 is comprised of a bcc non-magnetic material 1002. The bcc non-magnetic material 1002 interfaces with the free magnetic layer FM2. In addition, the bcc non-magnetic material 1002 can support the growth of the underlying bcc free magnetic layer FM2, e.g., a CoFeB layer. The bcc non-magnetic layer has a long spin diffusion length to maintain the large perpendicular spin-polarization of the current after passing through the polarizer. Table 2 below summarizes some of the materials that can be used as the bcc non-magnetic material 1002. The thickness of the N1 layer when used with any of these materials can be less or approximately equal to the spin diffusion length of the material used as the bcc non-magnetic material 1002.

TABLE 2

| Material | Atomic Number | Crystal Structure | Magnetic Order | Spin Diffusion Length/nm |
|---|---|---|---|---|
| V | 23 | Bcc | Paramagnetic | >40 |
| Cr | 24 | Bcc | Spin Density Wave Antiferromagnet | 4.5 at 4 K |
| Nb | 41 | Bcc | Paramagnetic | ~25 or 5.9 ± 0.3 |
| Mo | 42 | Bcc | Paramagnetic | 8.6 ± 1.3 |
| Ta | 73 | Bcc | Paramagnetic | 2.7 ± 0.4 |

Figure 11:
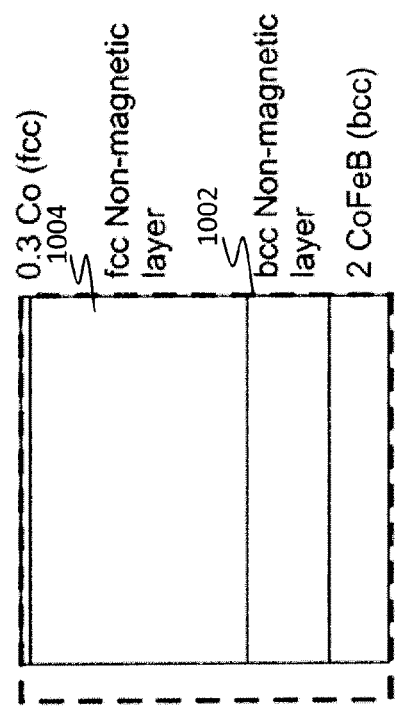
FIG. 11 is an illustration of a fcc and a bcc non-magnetic layer for use in an inverted layer stack in accordance with an illustrative implementation.

In another implementation, the non-magnetic layer N1 can be composed of both fcc and bcc materials. FIG. 11 is an illustration of an inverted layer stack with a fcc non-magnetic layer 1004 and a bcc non-magnetic layer 1002 in accordance with an illustrative implementation. In this implementation, the bcc non-magnetic layer 1002 is adjacent to the free magnetic layer FM1, e.g., CoFeB; and the fcc non-magnetic layer 1002 is adjacent to the polarizer. This ensures that the layers at the interlayer/polarizer interface have the same fcc crystal structure and also ensures that the layers at the interlayer/free layer interface have the same bcc crystal structure. Various fcc and bcc materials can be used in this implementation. Table 3 summarizes some of the non-limiting combinations of materials that can be used.

TABLE 3

| Material NM1/NM2 (thicknesses in nm) | Crystal Structure NM1/NM2 |
|---|---|
| 0.3 to 3 Ta/7 Cu | bcc/fcc |
| 0.3 to 3 Ta/7 Al | bcc/fcc |
| 0.3 to 3 Cr/7 Cu | bcc/fcc |
| 0.3 to 3 Cr/7 Al | bcc/fcc |
| [1 Cr/1 Cu] × 5 | bcc/fcc |

Figure 12:
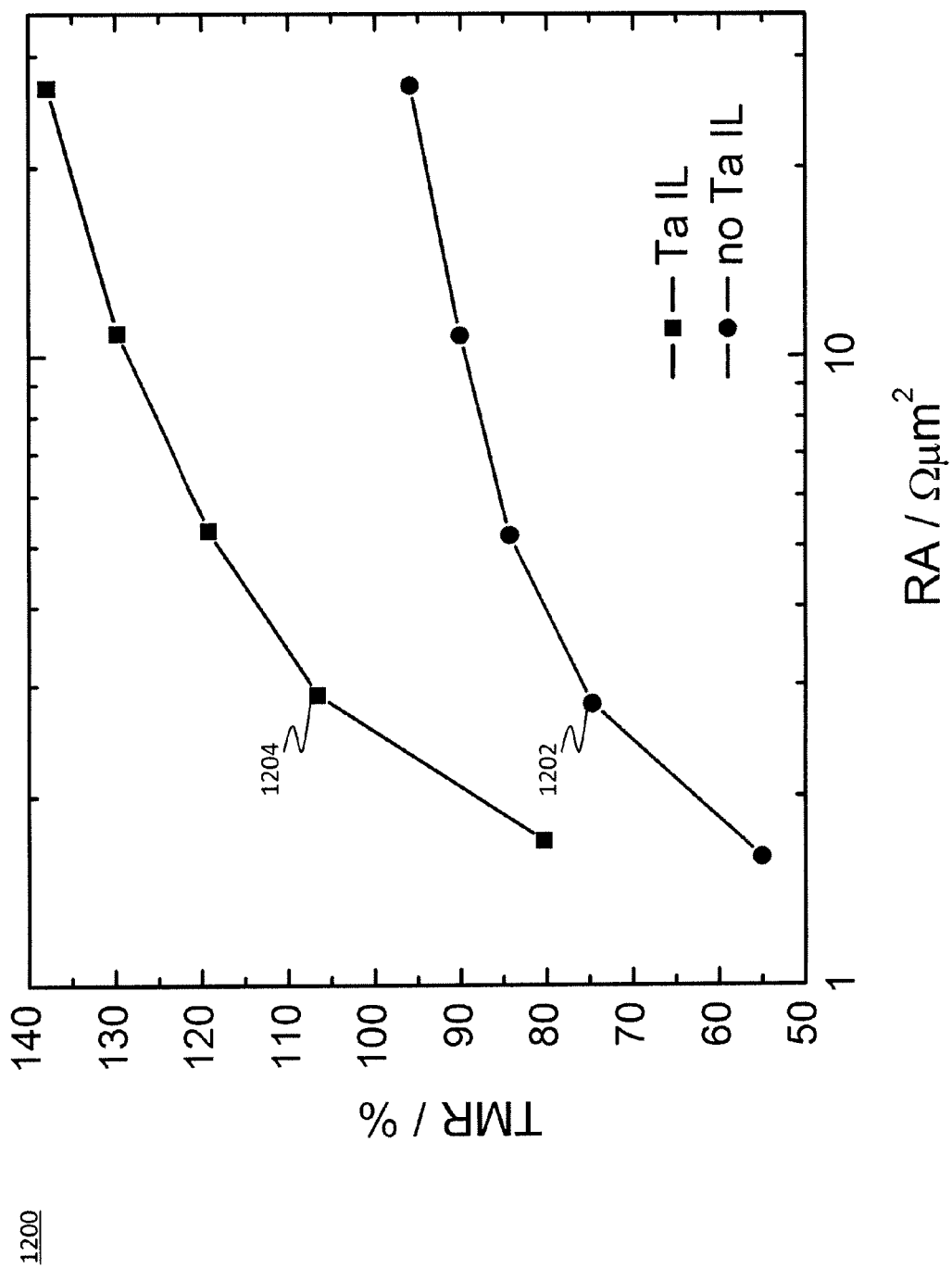
FIG. 12 is a graph of current in plane tunneling measurements of the magnetoresistance of two layer stacks in accordance with an illustrative implementation.

FIG. 12 is a graph 1200 of current in plane tunneling measurements of the magnetoresistance of two layer stacks in accordance with an illustrative implementation. The graph 1200 illustrates the magnetoresistance of the inverted layer stack that does not have a Ta interlayer 1202. Such an inverted layer stack is shown in FIGS. 8 and 9. The magnetoresistance of an inverted layer stack that includes a Ta interlayer and a copper fcc non-magnetic layer 1204 is also shown. FIG. 11 illustrates an example bcc non-magnetic interlayer. In testing, the MgO thickness was varied to produce layer stacks with different, systematically varying, resistance area (RA) products. This is shown in the X-axis of the graph 1200. The magnetoresistance was increased for inverted layer stacks that included a bcc non-magnetic interlayer for all resistance area product stacks studied.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated in a single software product or packaged into multiple software products.

Thus, particular implementations of the invention have been described. Other implementations are within the scope of the following claims. In some cases as one of skill in the art would understand after reading this disclosure, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A magnetic device comprising:
    a pinned magnetic layer having a first fixed magnetization vector with a first fixed magnetization direction;
    a free magnetic layer having a variable magnetization vector having at least a first stable state and a second stable state;
    a first non-magnetic layer spatially separating the pinned magnetic layer and the free magnetic layer;
    a reference magnetic layer having a second fixed magnetization vector with a second fixed magnetization direction; and
    a second non-magnetic layer spatially separating the free magnetic layer and the reference magnetic layer, wherein a magnetic tunnel junction is formed by the free magnetic layer, the second non-magnetic layer, and the reference magnetic layer, wherein application of a current pulse, having a selected amplitude and duration, through the magnetic device switches the variable magnetization vector, and wherein the magnetic tunnel junction is spatially located below the pinned magnetic layer.

2. The magnetic device of claim 1, wherein the first fixed magnetization vector is perpendicular to a plane of the pinned magnetic layer.

3. The magnetic device of claim 1, further comprising a synthetic antiferromagnet layer comprising the pinned magnetic layer.

4. The magnetic device of claim 3, wherein the synthetic antiferromagnet layer reduces magnetic interactions between the pinned magnetic layer and the free magnetic layer.

5. The magnetic device of claim 3, wherein the synthetic antiferromagnet layer is a material selected from the group consisting of ruthenium, chromium, or copper.

6. The magnetic device of claim 3, further comprising an antiferromagnet that pins the synthetic antiferromagnet layer providing a perpendicular exchange bias.

7. The magnetic device of claim 6, wherein the antiferromagnet is comprised of iridium manganese.

8. The magnetic device of claim 1, wherein the second non-magnetic insulating layer has an amplitude of roughness less than or equal to 0.8 nanometers.

9. The magnetic device of claim 1, wherein the second non-magnetic insulating layer has a wavelength of roughness less than or equal to 23.2 nanometers.

10. The magnetic device of claim 1, further comprising a second magnetic tunnel junction comprising the pinned magnetic layer and the free magnetic layer.

11. The magnetic device of claim 1, wherein the variable magnetization vector represents a bit of information.

12. A memory system comprising:
    a memory cell comprising:
        a pinned magnetic layer having a first fixed magnetization vector with a first fixed magnetization direction;
        a free magnetic layer having a variable magnetization vector having at least a first stable state and a second stable state;

a first non-magnetic layer spatially separating the pinned magnetic layer and the free magnetic layer;

a reference magnetic layer having a second fixed magnetization vector with a second fixed magnetization direction; and a second non-magnetic layer spatially separating the free magnetic layer and the reference magnetic layer, wherein a magnetic tunnel junction is formed by the free magnetic layer, the second non-magnetic layer, and the reference magnetic layer, wherein application of a current pulse, having a selected amplitude and duration, through the magnetic device switches the variable magnetization vector, and wherein the magnetic tunnel junction is spatially located below the pinned magnetic layer; and a current source connected to the pinned magnetic layer and the reference magnetic layer such that current passes from the second non-magnetic layer to the pinned magnetic layer.

13. The memory system of claim 12, wherein the memory cell further comprises a synthetic antiferromagnet layer, wherein the synthetic antiferromagent layer comprises the pinned magnetic layer.

14. The memory system of claim 13, wherein the synthetic antiferromagnet layer reduces magnetic interactions between the pinned magnetic layer and the free magnetic layer.

15. The memory system of claim 13, wherein the synthetic antiferromagnet layer is a material selected from the group consisting of ruthenium, chromium, or copper.

16. The memory system of claim 13, further comprising an antiferromagnet that pins the synthetic antiferromagnet layer providing a perpendicular exchange bias.

17. The memory system of claim 12, further comprising a second magnetic tunnel junction comprising the pinned magnetic layer and the free magnetic layer.

18. A method of making a memory device, comprising:

forming a second non-magnetic layer spatially separating a free magnetic layer and a reference magnetic layer, wherein a magnetic tunnel junction is formed by the free magnetic layer, the second non-magnetic layer, and the reference magnetic layer, wherein application of a current pulse, having either positive or negative polarity and a selected amplitude and duration, through the magnetic device switches a variable magnetization vector of the free magnetic layer, and wherein the magnetic tunnel junction is spatially located below the pinned magnetic layer forming the reference magnetic layer having a second fixed magnetization vector with a second fixed magnetization direction;

forming a first non-magnetic layer spatially separating the pinned magnetic layer and the free magnetic layer;

forming a free magnetic layer having the variable magnetization vector having at least a first stable state and a second stable state; and forming a pinned magnetic layer having a first fixed magnetization vector with a first fixed magnetization direction.

19. The method of making a memory device of claim 18, further comprising forming a synthetic antiferromagnet layer, wherein the synthetic antiferromagent layer comprises the pinned magnetic layer.

20. The method of making a memory device of claim 19, wherein the synthetic antiferromagnet layer reduces magnetic interactions between the pinned magnetic layer and the free magnetic layer.

* * * * *